(12) United States Patent
Lee et al.

(10) Patent No.: US 11,569,313 B2
(45) Date of Patent: Jan. 31, 2023

(54) DISPLAY DEVICE WITH METAL LAYER BETWEEN PIXEL DEFINING LAYER AND OPPOSITE ELECTRODE

(71) Applicant: Samsung Display Co., Ltd., Yongin-si (KR)

(72) Inventors: Minsu Lee, Yongin-si (KR); Deokhoi Kim, Yongin-si (KR); Sungin Ro, Yongin-si (KR); Soomin Lee, Yongin-si (KR); Changyong Lee, Yongin-si (KR); Sanghyun Lim, Yongin-si (KR); Soonmyung Hong, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 246 days.

(21) Appl. No.: 16/880,517

(22) Filed: May 21, 2020

(65) Prior Publication Data

US 2021/0134902 A1 May 6, 2021

(30) Foreign Application Priority Data

Nov. 1, 2019 (KR) ........................ 10-2019-0138769

(51) Int. Cl.
*H01L 27/32* (2006.01)
*H01L 51/52* (2006.01)

(52) U.S. Cl.
CPC ...... *H01L 27/3246* (2013.01); *H01L 27/3276* (2013.01); *H01L 51/5253* (2013.01); *H01L 2251/308* (2013.01)

(58) Field of Classification Search
CPC ............ H01L 27/3246; H01L 27/3276; H01L 51/5253; H01L 2251/308
See application file for complete search history.

(56) References Cited

U.S. PATENT DOCUMENTS

| | | | |
|---|---|---|---|
| 7,116,044 B2 * | 10/2006 | Fukunaga | ........... H01L 27/3244 313/506 |
| 7,303,635 B2 | 12/2007 | Yamaguchi | |
| 7,839,083 B2 | 11/2010 | Kubota | |
| 8,786,185 B2 | 7/2014 | Kashiwabara et al. | |
| 9,088,003 B2 | 7/2015 | Gupta et al. | |
| 10,050,100 B2 | 8/2018 | Lee et al. | |

(Continued)

FOREIGN PATENT DOCUMENTS

| | | |
|---|---|---|
| JP | 5401784 | 1/2014 |
| KR | 10-2016-0087990 | 7/2016 |
| KR | 10-2017-0126556 | 11/2017 |

*Primary Examiner* — Lex H Malsawma
(74) *Attorney, Agent, or Firm* — Kile Park Reed & Houtteman PLLC

(57) ABSTRACT

A display device includes a metal layer between a pixel-defining layer and an opposite electrode, the metal layer contacting the opposite electrode. The display device includes subpixels disposed on a substrate. The sub-pixels each include a pixel electrode, an opposite electrode facing the pixel electrode, an emission layer disposed between the pixel electrode and the opposite electrode, a pixel-defining layer surrounding the emission layer. The display device includes a metal layer disposed between the pixel-defining layer and the opposite electrode, the metal layer contacting the opposite electrode.

23 Claims, 14 Drawing Sheets

(56) References Cited

U.S. PATENT DOCUMENTS

| | | | | |
|---|---|---|---|---|
| 2002/0158835 A1* | 10/2002 | Kobayashi | ..........  | H01L 27/3244 345/100 |
| 2005/0001546 A1* | 1/2005 | Yamaguchi | ......... | H01L 51/5253 313/506 |
| 2005/0007015 A1* | 1/2005 | Yokoyama | .......... | H01L 51/5228 313/506 |
| 2005/0012105 A1* | 1/2005 | Yamazaki | ............ | H01L 27/3216 257/79 |
| 2005/0077814 A1* | 4/2005 | Koo | .................... | H01L 27/3276 313/500 |
| 2006/0273712 A1* | 12/2006 | Yaegashi | ............. | H01L 51/5228 313/503 |
| 2007/0063645 A1* | 3/2007 | Yokoyama | .......... | H01L 27/3258 313/506 |
| 2010/0097295 A1* | 4/2010 | Kwak | ................. | H01L 51/5284 345/32 |
| 2014/0124772 A1* | 5/2014 | Kashiwabara | ...... | H01L 51/5203 257/40 |
| 2016/0035803 A1* | 2/2016 | Kim | ................... | H01L 27/3246 438/34 |
| 2016/0204171 A1 | 7/2016 | Lee et al. | | |

* cited by examiner

DISPLAY DEVICE WITH METAL LAYER BETWEEN PIXEL DEFINING LAYER AND OPPOSITE ELECTRODE

CROSS-REFERENCE TO RELATED APPLICATION(S)

This application claims priority to and benefits of Korean Patent Application No. 10-2019-0138769 under 35 U.S.C. § 119, filed in the Korean Intellectual Property Office on Nov. 1, 2019, the entire contents of which are incorporated herein by reference.

BACKGROUND

1. Technical Field

One or more embodiments relate to a display device having an improved power supply structure of an opposite electrode.

2. Description of the Related Art

A display device such as an organic light-emitting display device may display color based on a principle in which a hole and an electron respectively injected from an anode and a cathode recombine in an emission layer. The display device may have a structure in which the emission layer may be disposed (e.g., arranged) between a pixel electrode, which may be the anode, and an opposite electrode, which may be the cathode.

A unit pixel of the display device may include sub-pixels that may include different colored pixels, such as a red sub-pixel, a green sub-pixel, and a blue sub-pixel. A desired color may be expressed by a color combination of these sub-pixels. For example, each sub-pixel may have a structure in which an emission layer may be disposed between two electrodes, the emission layer emitting red, green, or blue light. A color of a unit pixel may be expressed by an appropriate combination of these colors.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Here, generally, the opposite electrode may include a thin metal layer that may entirely cover all sub-pixels. In the case of metal, since a thickness of a layer may be inversely proportional to a resistance, high-temperature heat emission, a voltage drop, etc. due to high resistance of the opposite electrode frequently occur.

It may be difficult to display a uniform and clear image, and product reliability may be reduced. Therefore, improvement measures may be desirable.

Therefore, one or more embodiments may include an improved display device in which issues due to a high resistance of an opposite electrode may be efficiently resolved.

However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments of the disclosure.

According to one or more embodiments, a display device may include sub-pixels disposed on a substrate, the sub-pixels each including a pixel electrode, an opposite electrode facing the pixel electrode, an emission layer disposed between the pixel electrode and the opposite electrode, a pixel-defining layer surrounding the emission layer. The display device may include a metal layer disposed between the pixel-defining layer and the opposite electrode, the metal layer contacting the opposite electrode.

The display device may include an inorganic protective layer disposed between the metal layer and the pixel-defining layer.

The inorganic protective layer may include material including at least one of indium zinc oxide (IZO), indium tin oxide (ITO), silicon oxide ($SiO_2$), silicon oxynitride (SiON), and silicon nitride ($SiN_x$).

The metal layer may include at least one layer of titanium (Ti) and at least one layer of aluminum.

The at least one layer of titanium (Ti) and the at least one layer of aluminum (Al) may be stacked each other The metal layer may include pad portions contacting the opposite electrode above the pixel-defining layer, and connectors electrically connecting the pad portions.

The connectors may be disposed in a mesh shape crossing in a horizontal direction and a vertical direction, and the pad portions may be disposed at intersections of the mesh shape.

The pad portions may be disposed at every intersection.

The pad portions may be intermittently disposed at less than all of the intersections.

All of the pad portions may contact the opposite electrode.

Less than all of the pad portions may contact the opposite electrode.

The display device may include spacers disposed on the pixel-defining layer, the spacers protruding toward the opposite electrode.

The spacers may be disposed for all of the sub-pixels.

The spacers may be disposed for less than all of the sub-pixels.

The pad portions may be disposed on all of the spacers.

The pad portions may be disposed on less than all of the spacers.

The display device may include a display area in which the subpixels may be disposed, and a cathode power supply unit may be disposed outside the display area, wherein the cathode power supply unit applies a same voltage to the opposite electrode of each sub-pixel and the metal layer.

The display area may include a first side, a second side, a third side, and a fourth side, wherein the first side and the second side may face each other, the third side connects an end portion of the first side to an end portion of the second side, and the fourth side connects another end portion of the first side to another end portion of the second side. The cathode power supply unit may include a power supply line surrounding the first side, the second side, and the third side, and surrounding a portion of the fourth side outside the display area, a connection terminal of the metal layer electrically connected to the power supply line, and a connection terminal of the opposite electrode electrically connected to the connection terminal of the metal layer.

The display device may further include an intermediate connection terminal disposed between the power supply line and the connection terminal of the metal layer, wherein the intermediate connection terminal and the pixel electrode may include a same material, and may be disposed on a same layer, and respective layers from the power supply line to the connection terminal of the opposite electrode may be disposed stepwise such that a step difference may be provided between the respective layers.

A portion in which the power supply line, the metal layer, and the opposite electrode may be electrically connected may include a portion in which the power supply line surrounds the first, second, and third sides.

The portion in which the power supply line, the metal layer, and the opposite electrode may be electrically connected may include a portion in which the power supply line surrounds a portion of the fourth side.

These and/or other aspects will become apparent and more readily appreciated from the following description of the embodiments, the accompanying drawings, and claims.

However, the above effect may be provided as an example, and effects according to embodiments are described in detail through description below.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
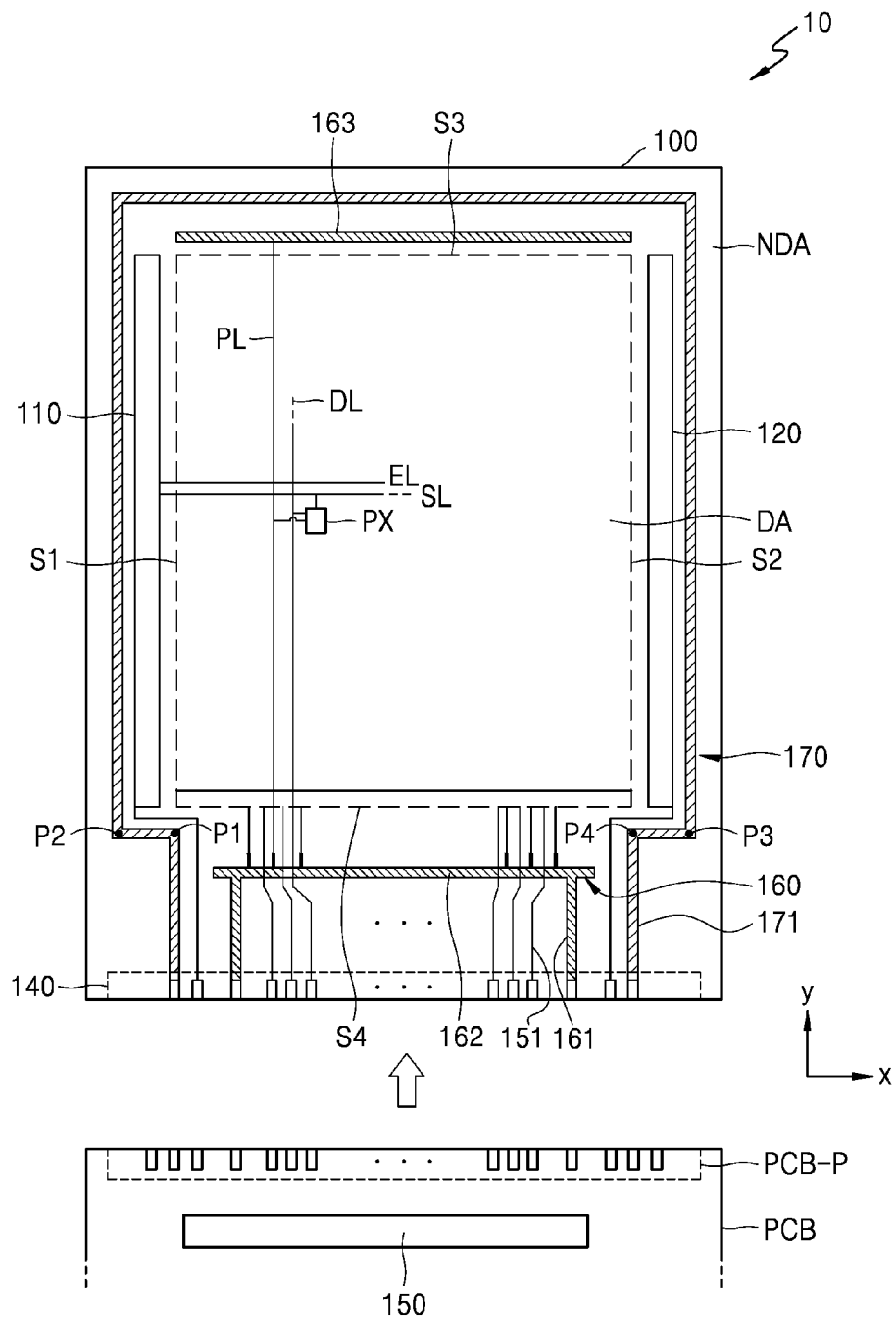
FIG. 1 is a schematic plan view of a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. The terms "and" and "or" may be used in the conjunctive or disjunctive sense and may be understood to be equivalent to "and/or." Throughout the disclosure, the expression "at least one of a, b and c" indicates only a, only b, only c, both a and b, both a and c, both b and c, all of a, b, and c, or variations thereof.

Hereinafter, the embodiments are described in detail with reference to the accompanying drawings. In the drawings, the same reference numerals may be given to the same or corresponding elements, and repeated description thereof may be omitted.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following embodiments are not limited thereto.

Spatially relative terms, such as "horizontal", "vertical", "on", "above", "below" and the like, may be used herein for ease of description to describe one element's relationship to another element(s) as illustrated in the figures. Changing the orientation of an apparatus incorporating such an element may change the spatially relative orientation of the element to the other element(s), but such would still be understood to be within the scope of the disclosure.

When a certain embodiment may be implemented differently, a specific process order may be performed differently from the described order. For example, two consecutively described processes may be performed substantially at the same time or performed in an order opposite to the described order.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic plan view of a display device according to an embodiment.

Referring to FIG. 1, a display panel 10 may include sub-pixels Px disposed in a display area DA. Each of the sub-pixels Px may include a display element such as an organic light-emitting diode. Each sub-pixel Px may emit, for example, red, green, blue, or white light. As described above, a sub-pixel Px may be a pixel that emits light such as light of red, green, blue, or white color. The display area DA may be protected from external air or moisture, etc. by being covered by an encapsulation layer 400 as described below.

Each sub-pixel Px may be electrically connected to outer circuits in a non-display area NDA. A first scan driving circuit 110, a second scan driving circuit 120, a terminal 140, a data driving circuit 150, a first power supply line 160, and a second power supply line 170 may be disposed in the non-display area NDA.

The first scan driving circuit 110 may provide a scan signal to each sub-pixel Px through a scan line SL. The first scan driving circuit 110 may provide an emission control signal to each sub-pixel Px through an emission control line EL. The second scan driving circuit 120 may be disposed in parallel to the first scan driving circuit 110 with the display area DA therebetween. Some of the sub-pixels Px disposed in the display area DA may be electrically connected to the first scan driving circuit 110, and others of the sub-pixels Px may be electrically connected to the second scan driving circuit 120.

The terminal 140 may be disposed on one side of a substrate 100. The terminal 140 may be exposed and electrically connected to a printed circuit board PCB by not being covered by an insulating layer. A terminal PCB-P of the printed circuit board PCB may be electrically connected to the terminal 140 of the display panel 10. The printed circuit board PCB may be configured to transfer a signal of a controller (not shown) or power to the display device. Control signals generated by the controller may be respectively transferred to the first and second scan driving circuits 110 and 120 through the printed circuit board PCB. The controller may respectively provide first and second power voltages ELVDD and ELVSS to the first and second power supply lines 160 and 170 through first and second connection lines 161 and 171. The first power voltage ELVDD may be provided to each sub-pixel Px through a driving voltage line PL electrically connected to the first power supply line 160, and the second power voltage ELVSS may be provided to an opposite electrode 330 (see FIG. 2) of each sub-pixel Px electrically connected to the second power supply line 170. The second power supply line 170 may constitute a cathode power supply unit configured to supply the second power voltage ELVSS to a metal layer 360 (see FIG. 2) together with the opposite electrode 330, which will be described below.

The data driving circuit 150 may be electrically connected to the data line DL. A data signal of the data driving circuit 150 may be provided to each sub-pixel Px through a connection line 151 and the data line DL, the connection line 151 being electrically connected to the terminal 140, and the data line DL being electrically connected to the connection line 151. Though it is shown in FIG. 1 that the data driving circuit 150 may be disposed on the printed circuit board PCB, the data driving circuit 150 may be disposed on the substrate 100 in an embodiment. For example, the data driving circuit 150 may be disposed between the terminal 140 and the first power supply line 160.

The first power supply line 160 may include a first sub-line 162 and a second sub-line 163 that may be parallel to each other with the display area DA therebetween and extending in an x-direction. The second power supply line 170 may have a loop shape having one open side and partially surround the display area DA. For example, assuming that a boundary line of the display area DA may be a quadrangle in which a first side S1, a second side S2, a third side S3, and a fourth side S4 may be connected to each other, the second power supply line 170 may entirely surround the first to third sides S1, S2, and S3 and may surround only a portion of the fourth side S4. Here, the cathode power supply unit may be provided to a portion that surrounds the first to third sides S1, S2, and S3 or may extend to a portion that surrounds a portion of the fourth side S4. For example, assuming that two points at which the second connection line 171 meets the second power supply line 170 may be points P1 and P4, and that two points at which a portion of the fourth side S4 of the second power supply line 170 meets a portion of the first and second sides S1 and S2 may be points P2 and P3, the cathode power supply unit may be provided to a portion from the point 2 to the point 3 that surrounds the first to third sides S1, S2, and S3, or the cathode power supply unit may be provided over a portion from the point P1 to the point 4 in which the second power supply line 170 may entirely surround the first to third sides S1, S2, and S3 and may surround a portion of the fourth side S4. Since, when a contact area through which power may be supplied to the opposite electrode 330 may be increased, the movement of an electric charge may be faster as in the latter case, the latter case may be more effective in reducing a resistance of the opposite electrode 330, heat emission of high temperature, a noise, etc. A description thereof is provided herein.

A schematic cross-sectional stacked structure of a sub-pixel Px is described with reference to FIG. 2.

Figure 2:
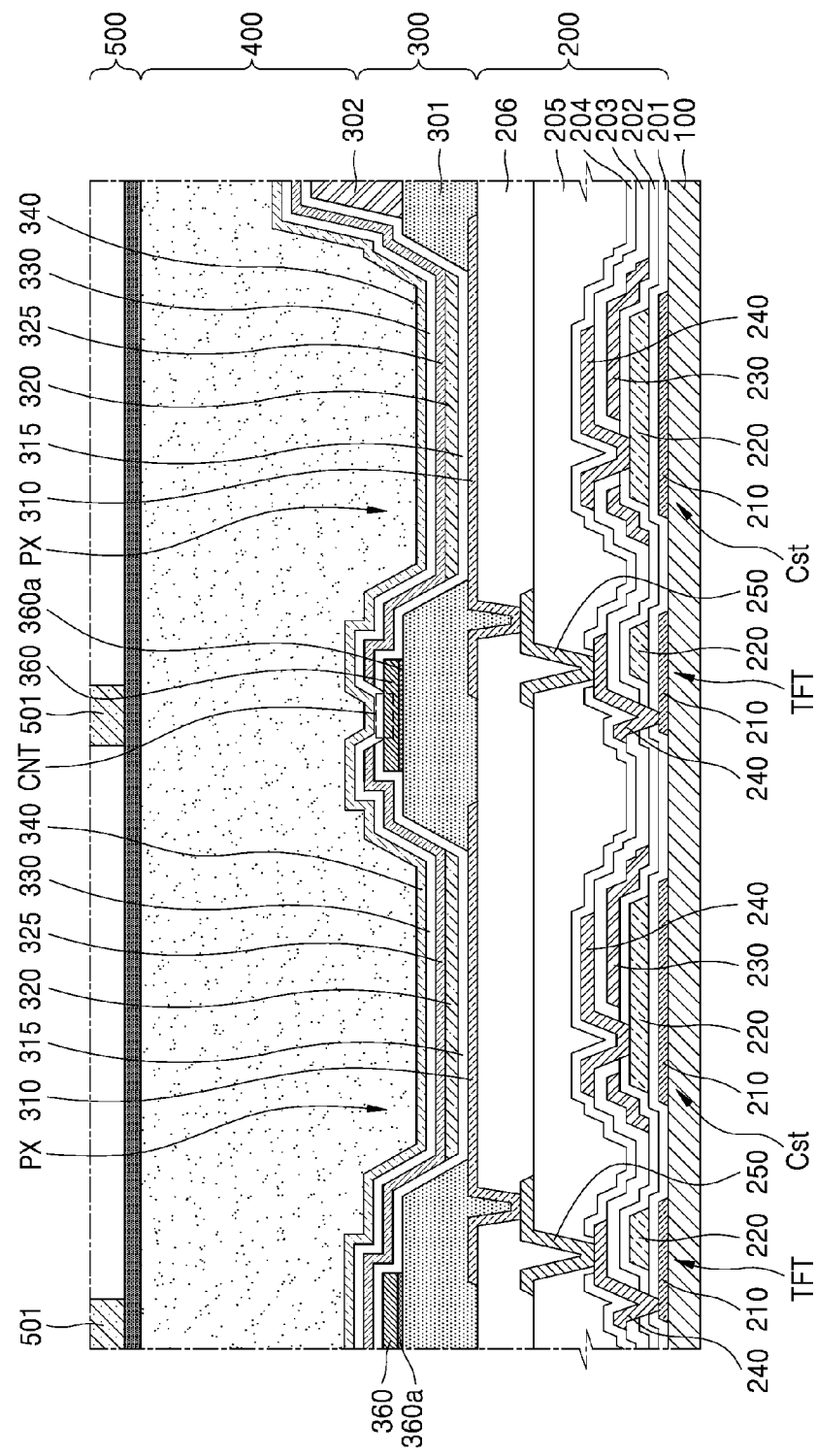
FIG. 2 is a schematic cross-sectional view of a structure of sub-pixels disposed inside a display area of FIG. 1.

Referring to FIG. 2, the substrate 100 may include a glass material or a polymer resin.

A circuit unit 200 may be disposed on the substrate 100. The circuit unit 200 may include a thin film transistor TFT and a capacitor Cst. The thin film transistor TFT may include a semiconductor layer 210, a first gate electrode 220, a first source-drain electrode 240, and a second source-drain electrode 250. The capacitor Cst may include the first gate electrode 220 over the semiconductor layer 210, a second gate electrode 230, and the first source-drain electrode 240.

The semiconductor layer 210 may include polycrystalline silicon. As another example, the semiconductor layer 210 may include amorphous silicon, an oxide semiconductor, an organic semiconductor, or a combination thereof. The first and second gate electrodes 220 and 230 may include a low-resistance metal material. The first and second gate electrodes 220 and 230 may include a conductive material including molybdenum (Mo), aluminum (Al), copper (Cu), titanium (Ti), or a combination thereof, and include a single layer or a multi-layer including the above materials.

A gate insulating layer 201 between the semiconductor layer 210 and the first gate electrode 220 may include an inorganic insulating material such as silicon oxide, silicon nitride, and silicon oxynitride, aluminum oxide, titanium oxide, tantalum oxide, hafnium oxide, or a combination thereof. The gate insulating layer 201 may include a single layer or a multi-layer including the above materials.

The first and second source-drain electrodes 240 and 250 may include a material having excellent conductivity. The first and second source-drain electrodes 240 and 250 may include a conductive material including molybdenum (Mo), aluminum (Al), copper (Cu), titanium (Ti), or a combination thereof and may include a single layer or a multi-layer including the above materials. In an embodiment, the first and second source-drain electrodes 240 and 250 may include a multi-layer of Ti/Al/Ti.

A first interlayer insulating layer 202 and a second interlayer insulating layer 203 may include an inorganic insulating material such as silicon oxide, silicon nitride, silicon oxynitride, aluminum oxide, titanium oxide, tantalum oxide, hafnium oxide, or a combination thereof. The first interlayer insulating layer 202 and the second interlayer insulating layer 203 may include a single layer or a multi-layer including the above materials.

Reference numerals 205 and 206 respectively represent a first organic insulating layer and a second organic insulating layer.

The first and second source-drain electrodes 240 and 250 of the thin film transistor TFT may be electrically connected to a pixel electrode 310. For example, the first source-drain electrode 240 may be electrically connected to the second source-drain electrode 250 through a contact hole formed in the first organic insulating layer 205. The second source-drain electrode 250 may be electrically connected to the pixel electrode 310 through a contact hole formed in the second organic insulating layer 206.

The first organic insulating layer 205 and the second organic insulating layer 206 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a combination thereof. In an embodiment, the first organic insulating layer 205 and the second organic insulating layer 206 may include polyimide.

An emission unit 300 may be provided on the circuit unit 200.

The pixel electrode 310 of the emission unit 300 may be formed on the second organic insulating layer 206 and connected to the thin film transistor TFT. The pixel electrode 310 may include a conductive oxide such as indium tin oxide (ITO), indium zinc oxide (IZO), zinc oxide (ZnO), indium oxide ($In_2O_3$), indium gallium oxide (IGO), aluminum zinc oxide (AZO), or a combination thereof. In another embodiment, the pixel electrode 310 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a combination thereof. In another embodiment, the pixel electrode 310 may further include a layer on/under the reflective layer, the layer including ITO, IZO, ZnO, $In_2O_3$ or a combination thereof.

A pixel-defining layer 301 may be formed on the pixel electrode 310, the pixel-defining layer 301 defining an emission area of the sub-pixel Px. The pixel-defining layer 301 may include an opening exposing a top surface of the pixel electrode 310 and cover edges of the pixel electrode 310. The pixel-defining layer 301 may define the emission area by surrounding an emission layer 320 of each sub-pixel Px. The pixel-defining layer 301 may include an organic insulating material. As another example, the pixel-defining layer 301 may include silicon nitride ($SiN_x$), silicon oxynitride (SiON), silicon oxide ($SiO_x$), or a combination thereof. As another example, the pixel-defining layer 301 may include an organic insulating material and an inorganic insulating material.

A first functional layer 315, the emission layer 320, and a second functional layer 325 may be stacked on the pixel electrode 310. The emission layer 320 may include a polymer organic material or a low molecular weight organic material emitting light having a predetermined color.

The first functional layer 315 may include a single layer or a multi-layer. For example, in the case where the first functional layer 315 includes a polymer material, the first functional layer 315 may be a hole transport layer (HTL), which may have a single-layered structure, and may include poly (3, 4-ethylenedioxythiophene) (PEDOT) or polyaniline (PANI). In the case where the first functional layer 315 include a low molecular weight material, the first functional layer 315 may include a hole injection layer (HIL) and an HTL.

The second functional layer 325 may include a single layer or a multi-layer. The second functional layer 325 may include an electron transport layer (ETL) and/or an electron injection layer (EIL).

The emission layer 320 may be disposed in an emission area of each sub-pixel Px defined by the pixel-defining layer 301. The first functional layer 315 and the second functional layer 325 may be formed over all sub-pixels in the display area DA.

The opposite electrode 330 may include a conductive material having a low work function. For example, the opposite electrode 330 may include a (semi)-transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or a combination thereof. As another example, the opposite electrode 330 may further include a layer on the (semi)-transparent layer, the layer including ITO, IZO, ZnO, $In_2O_3$ or a combination thereof. The opposite electrode 330 may be formed over all the sub-pixels Px in the display area DA.

A capping layer 340 may be located on the opposite electrode 330. For example, the capping layer 340 may include LiF. In an embodiment, the capping layer 340 may be omitted.

A spacer 302 may be formed on the pixel-defining layer 301. The spacer 302 may include an organic insulating material such as polyimide. As another example, the spacer 302 may include an inorganic insulating material or include an organic insulating material and an inorganic insulating material.

The spacer 302 may include a material different from that of the pixel-defining layer 301 or include the same material as that of the pixel-defining layer 301. In an embodiment, the pixel-defining layer 301 and the spacer 302 may include polyimide. The pixel-defining layer 301 and the spacer 302 may be formed (e.g., simultaneously formed) during a mask process that may use a halftone mask. The spacer 302 may be formed for each sub-pixel Px or intermittently formed one by one for every several sub-pixels Px. For example, the spacer 302 may be disposed one by one for every 2×2 sub-pixels, or every 4×4 sub-pixels in planar arrangement of the sub-pixels Px. In other words, the spacers 302 may be formed for all the sub-pixels Px and densely disposed, or be disposed one by one for every N×N sub-pixels Px with an interval therebetween.

The emission unit 300 may be covered by the encapsulation layer 400. The encapsulation layer 400 may include at least one organic encapsulation layer and at least one inorganic encapsulation layer.

The inorganic encapsulation layer may include at least one inorganic material among aluminum oxide, titanium oxide, tantalum oxide, hafnium oxide, zinc oxide, silicon oxide, silicon nitride, and silicon oxynitride.

The organic encapsulation layer may include a polymer-based material. The polymer-based material may include an acryl-based resin, an epoxy-based resin, polyimide, polyethylene, or a combination thereof. In an embodiment, the organic encapsulation layer may include acrylate.

Reference numeral 500 represents a touchscreen that may include a touch electrode 501.

Since the opposite electrode 330 may be formed as a thin metal layer in general, the opposite electrode 330 may have a high resistance and an issue such as heat emission of high temperature or a voltage drop may frequently occur.

Therefore, to resolve these issues, in an embodiment, a metal layer 360 may be formed on the pixel-defining layer 301 and may be electrically connected to the opposite electrode 330 at multiple locations. With this configuration, since a voltage may be applied to the opposite electrode 330 at multiple connection locations through the metal layer 360, an electric resistance of the opposite electrode 330 may be reduced, an issue such as a voltage drop may be remarkably reduced and heat emission may be reduced. A reference numeral 360a represents an inorganic protective layer.

A structure of the metal layer 360 that may reduce the resistance of the opposite electrode 330 is described.

Figure 3:
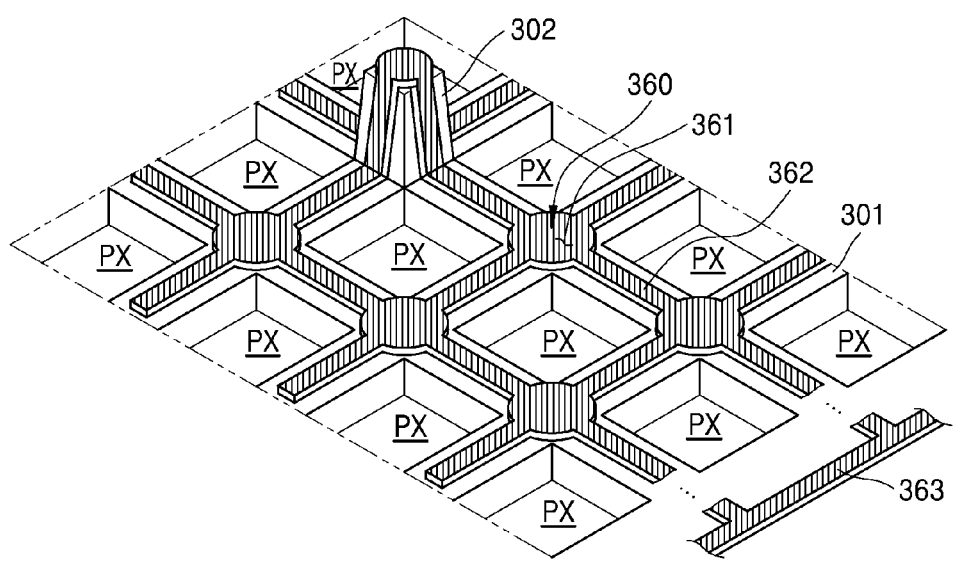
FIG. 3 is a schematic perspective view of a metal layer shown in FIG. 2.

Referring to FIG. 3, the metal layer 360 may include a pad portion 361 and a connector 362. The pad portion 361 may have a disk shape and may be disposed on the pixel-defining layer 301 and the spacer 302. The connector 362 may electrically connect the pad portions 361 in a mesh shape.

As shown in FIG. 2, the pad portion 361 may be a portion where the opposite electrode 330 may contact (e.g., directly contacts) the metal layer 360. The pad portion 361 may be a portion on which a laser beam may be irradiated (e.g., directly irradiated) while layers between the metal layer 360 and the opposite electrode 330 may be bored by using laser drilling. The pad portion 361 may have a width greater than a width of the connector 362. The pad portion 361 may be formed in a size sufficient to receive a laser beam spot such that the connector 362 that neighbors the pad portion 361 may not be damaged during the laser drilling.

The connectors 362 may be disposed on the pixel-defining layer 301 and the spacer 302 in a mesh shape that may be disposed in a horizontal direction and a vertical direction. The connectors 362 may electrically connect all the pad portions 301 as one body. Also, a connection terminal 363 may be prepared at an end portion of the metal layer 360 that may extend to the non-display area NDA. The connection terminal 363 may constitute one layer of the cathode power supply unit.

Also, for convenience of description, although not shown in FIG. 3, an inorganic protective layer 360a may be formed in the same pattern as that of the metal layer 360. The inorganic protective layer 360a may be between the pixel-defining layer 301 and the spacer 302.

Figure 4A:
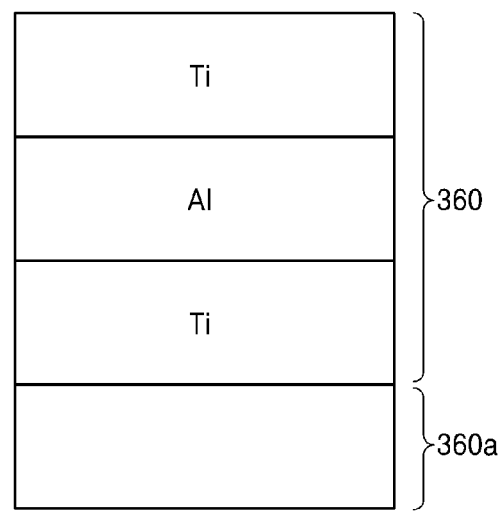
FIGS. 4A and 4B are schematic cross-sectional views of a metal layer shown in FIG. 3.
Figure 4B:
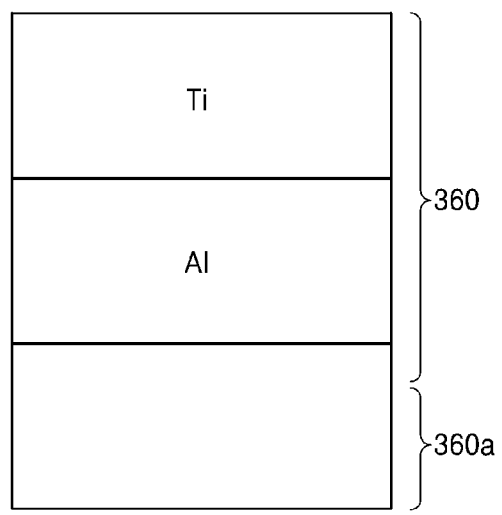

The metal layer 360 and the inorganic protective layer 360a may have a cross-sectional structure as shown in FIGS. 4A and 4B.

For example, as shown in FIG. 4A, the metal layer 360 may have a three-layered structure of Ti/Al/Ti. As another example, as shown in FIG. 4B, the metal layer 360 may have a two-layered structure of Ti/Al. The inorganic protective layer 360a may include at least one of IZO, ITO, $SiO_2$, SiON, and $SiN_x$.

Referring to FIG. 2 again, in case that the metal layer 360 may be formed, the first functional layer 315, the emission layer 320, and the second functional layer 325 may be formed (e.g., sequentially formed) on the pixel electrode 310. The emission layer 320 may be formed in a portion of a sub-pixel Px surrounded by the pixel-defining layer 301, and the first and second functional layers 315 and 325 may be formed as common layers over all the sub-pixels Px in the display area DA.

As described above, a contact hole may be formed by irradiating a laser beam to a location of the pad portion 361 of the metal layer 360 such that the opposite electrode 330 may contact the metal layer 360. For example, a hole may be bored in the first and second functional layers 315 and 325 on the pad portion 361 of the metal layer 360 by using a laser beam.

In case that the opposite electrode 330 may be formed, a structure in which the metal layer 360 contacts the opposite electrode 330 at multiple locations may be formed as shown in FIG. 2.

The capping layer 340, the encapsulation layer 400, and the touchscreen 500 may be formed (e.g., sequentially formed).

Since the second power voltage ELVSS may be applied to the opposite electrode 330 through the metal layer 360 in the above-manufactured structure, an issue of a voltage drop of the opposite electrode 330 may be resolved. Since a resistance of the opposite electrode 330 may be reduced, heat emission of high temperature may be remarkably reduced.

Furthermore, an issue due to various kinds of noises may be resolved. For example, signal jamming between neighboring sub-pixels Px or signal jamming due to a parasitic capacitance between the opposite electrode 330 and the touch electrode 501 may be resolved.

For example, since the first and second functional layers 315 and 325 may be formed as common layers over multiple sub-pixels Px, an electric charge of each sub-pixel Px may be introduced into a neighboring sub-pixel Px through the first and second functional layers 315 and 325 to cause a malfunction. In contrast, when the metal layer 360 may be located on the pixel-defining layer 301, since a leaked charge may be discharged to the outside through the metal layer 360, the leaked charge may not be introduced to a neighbor sub-pixel Px.

In case that the resistance of the opposite electrode 330 may be reduced by the metal layer 360, a movement velocity of a charge through the opposite electrode 330 may become very fast. Generally, a slow movement velocity of a charge can cause a parasitic capacitance. When a movement velocity of a charge may be fast as described above, a parasitic capacitance between the touch electrode 501 and the opposite electrode 330 may not occur or may be reduced.

Therefore, when the metal layer 360 may be disposed issues such as a voltage drop of the opposite electrode 330, heat emission of high temperature, a noise, etc. may be effectively resolved.

Though the above embodiment provides, as an example, the structure in which the pad portion 361 of the metal layer 360 may be formed on the pixel-defining layer 301 and the spacer 302 for every sub-pixel Px, some pad portions 361 may be omitted and the pad portions 361 may be intermittently disposed. A modifiable example thereof is described.

Figure 5A:
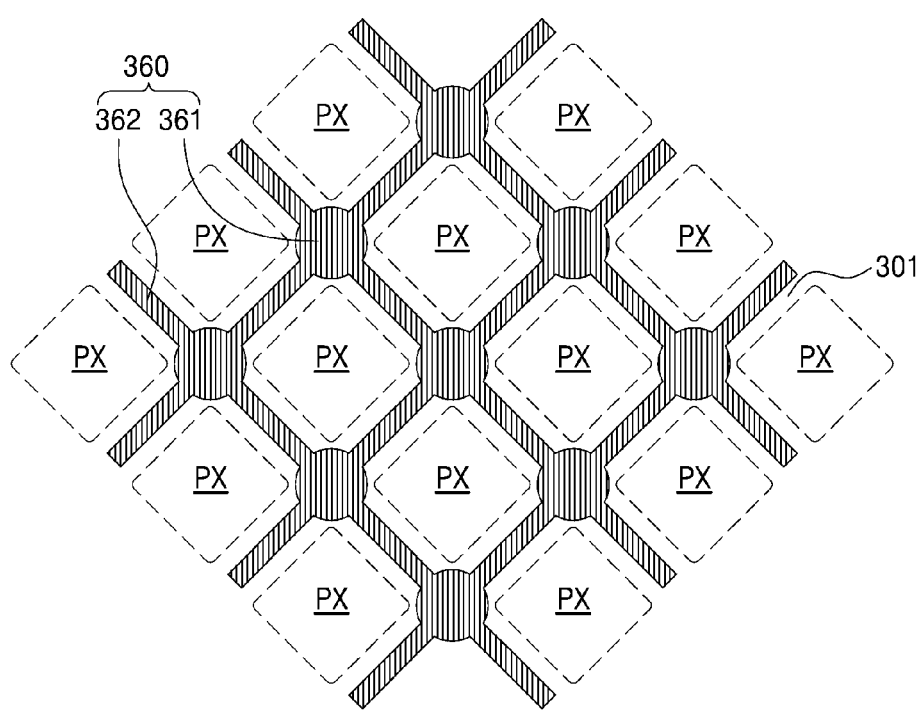
FIGS. 5A, 5B, 6A, and 6B are schematic plan views of a structure of a metal layer shown in FIG. 2.

As shown in FIG. 5A, the metal layer 360 includes the pad portion 361 and the connector 362 and may be disposed in a structure of a mesh shape when viewed in plan view. The pad portions 361 may be disposed at every intersection at which the connectors 362 cross each other in the horizontal direction and the vertical direction regardless of whether the spacer 302 may be provided. The structure of FIG. 3 may correspond to this configuration.

Figure 5B:
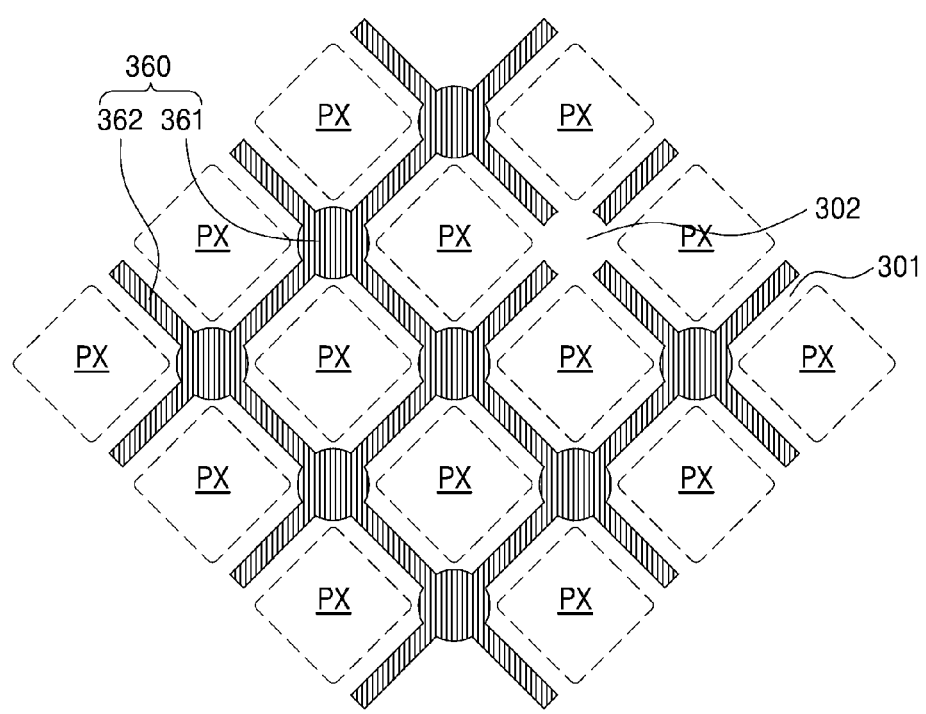

As shown in FIG. 5B, the pad portion 361 may not be formed on a portion where the spacer 302 may be provided. The spacer 302 may be disposed for every sub-pixel Px as described above, or disposed one by one for every N×N sub-pixels Px. Therefore, like various distribution possibilities of the spacer 302, the arrangement of the pad portions 361 on the spacers 302 may be variously modified. For example, the pad portions 361 may or may not be disposed on all the spacers 302, and further the pad portions 361 may be disposed on only some spacers 302 and omitted on the other spacers 302.

Although the embodiment of FIG. 3 provides the structure in which the pad portions 361 may be disposed at every intersection where the connectors 362 cross each other in the horizontal direction and the vertical direction, the pad portion 361 may be intermittently disposed in a modified configuration.

Figure 6A:
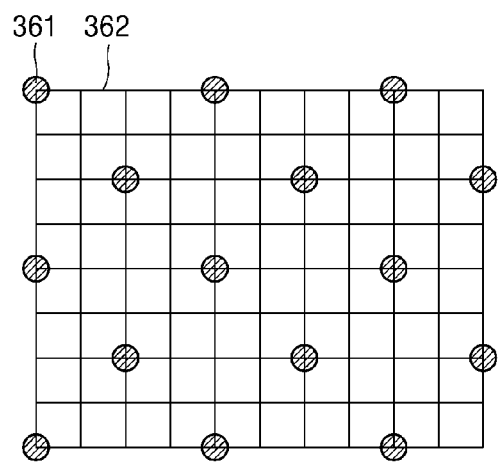
Figure 6B:
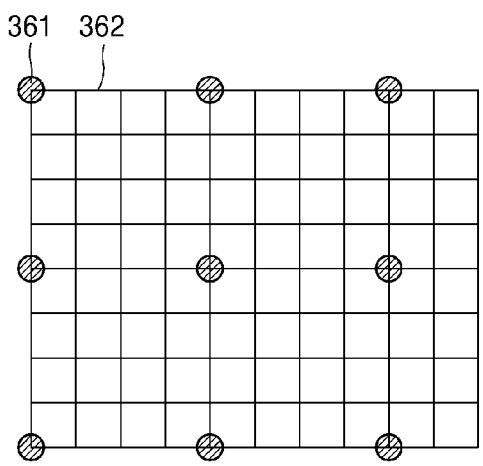

For example, as shown in FIG. 6A, the pad portion 361 may be disposed one by one at every 2×2 intersections based on intersections of the connectors 362 when viewed in plan view, or as shown in FIG. 6B, the pad portion 361 may be disposed one by one at every 4×4 intersections.

As another example, instead of forming the pad portions 361 at every intersection, contact holes through which the opposite electrode 330 may contact the metal layer 360 may be intermittently formed.

Figure 7A:
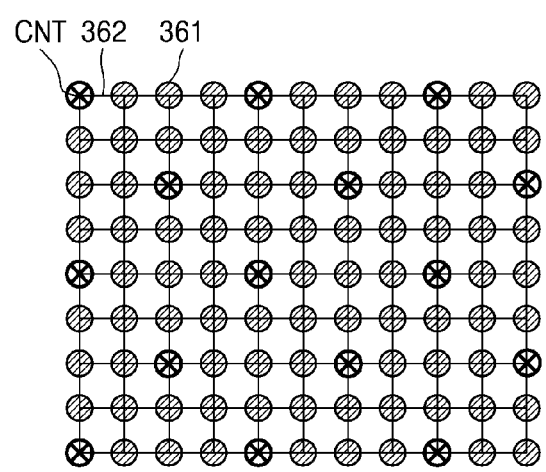
FIGS. 7A and 7B are schematic plan views of a structure of a modifiable contact location between a metal layer and an opposite electrode according to an embodiment.
Figure 7B:
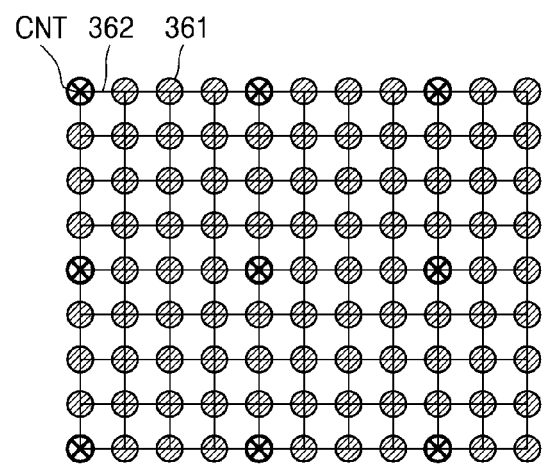

For example, as shown in FIG. 7A, contact holes CNT may be formed one by one at every 2×2 intersections by using laser drilling based on intersections of the connectors 362 when viewed in plan view, or as shown in FIG. 7B, the contact holes CNT may be disposed one by one at every 4×4 intersections.

The pad portion 361 may not need to have a disc shape and may have a polygonal shape, or the connector 362 may be made to have a wide width equal to a width of the pad portion 361 and thus have only a mesh shape crossing in the vertical direction and the horizontal direction.

The arrangement and the shape of the pad portion 361 for allowing the metal layer 360 to contact the opposite electrode 330 may be variously modified.

Hereinafter, a structure of the cathode voltage supply unit is described with reference to FIGS. 8A and 8B.

The cathode voltage supply unit may be a wiring connector configured to supply the second power voltage ELVSS to the opposite electrode 330. The cathode voltage supply unit may electrically connect the second power supply line 170 to a connection terminal 330a of the opposite electrode 330.

Figure 8A:
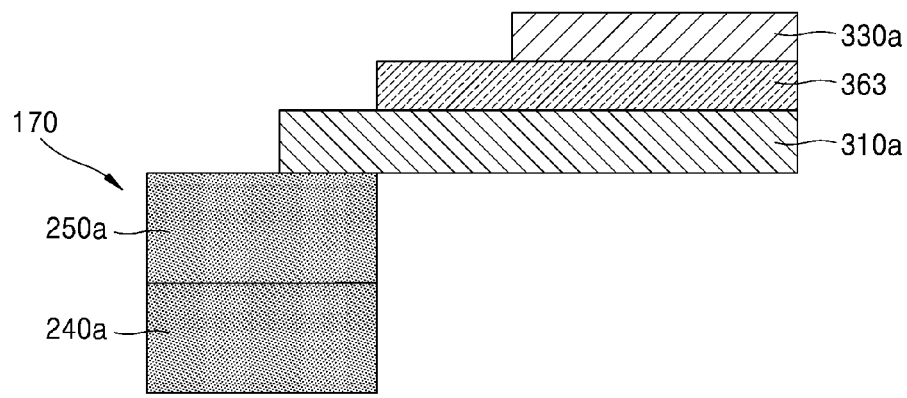
FIG. 8A is a schematic cross-sectional view of a wiring connection structure for supplying cathode power to a metal layer and an opposite electrode according to an embodiment.
Figure 8B:
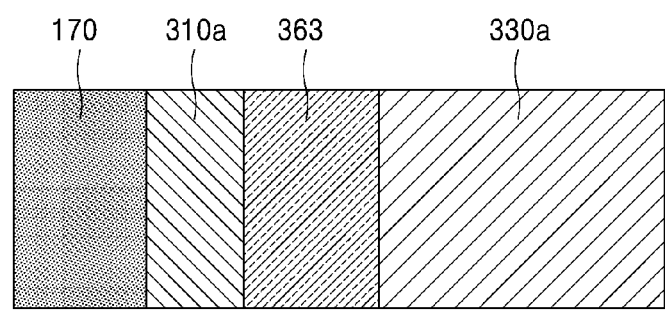
FIG. 8B is a schematic plan view of FIG. 8A.

Referring to FIG. 8A, the second power supply line 170 may include a first conductive layer 240a and a second conductive layer 250a. The first conductive layer 240a and the second conductive layer 250a may respectively include the same materials as those of the first source-drain electrode 240 and the second source-drain electrode 250. The first conductive layer 240a and the second conductive layer 250a may be respectively disposed on the same layer as layers of the first source-drain electrode 240 and the second source-drain electrode 250.

An intermediate connection terminal 310a may be disposed on the second power supply line 170. The intermediate connection terminal 310a may include the same material as that of the pixel electrode 310 and may be disposed on the same layer as a layer on which the pixel electrode 310 may be disposed. The connection terminal 363 of the metal layer 360 may be disposed on the intermediate connection terminal 310a, and the connection terminal 330a of the opposite electrode 330 may be disposed on the connection terminal 363.

The cathode voltage supply unit may be disposed in a stepwise configuration in which there may be a step difference between respective layers. When viewed in plan view, as shown in FIG. 8B, the cathode voltage supply unit may have a structure in which the second power supply line 170 may be in an outermost portion, and the intermediate connection terminal 310a, the connection terminal 363 of the metal layer 360, and the connection terminal 330a of the opposite electrode 330 may be sequentially indented toward the display area DA.

With this structure, the second power voltage ELVSS supplied to the second power supply line 170 may be supplied to the connection terminal 330a of the opposite electrode 330 through the intermediate connection terminal 310a and the connection terminal 363 of the metal layer 360, and inside the display area DA, the second power voltage ELVSS may be supplied also through a direct contact between the pad portion 361 of the metal layer 360 and the opposite electrode 330.

Therefore, the second power voltage ELVSS may be swiftly supplied to the opposite electrode 330 through the cathode voltage supply unit.

The cathode voltage supply unit that may be configured stepwise may be formed at a portion from the point P2 to the point P3 that surrounds the first to third sides S1, S2, and S3, or formed at a portion from the point P1 to the point P4 in which the second power supply line 170 surrounds all of the first to third sides S1, S2, and S3 and a portion of the fourth side S4 as described with reference to FIG. 2.

Figure 9:
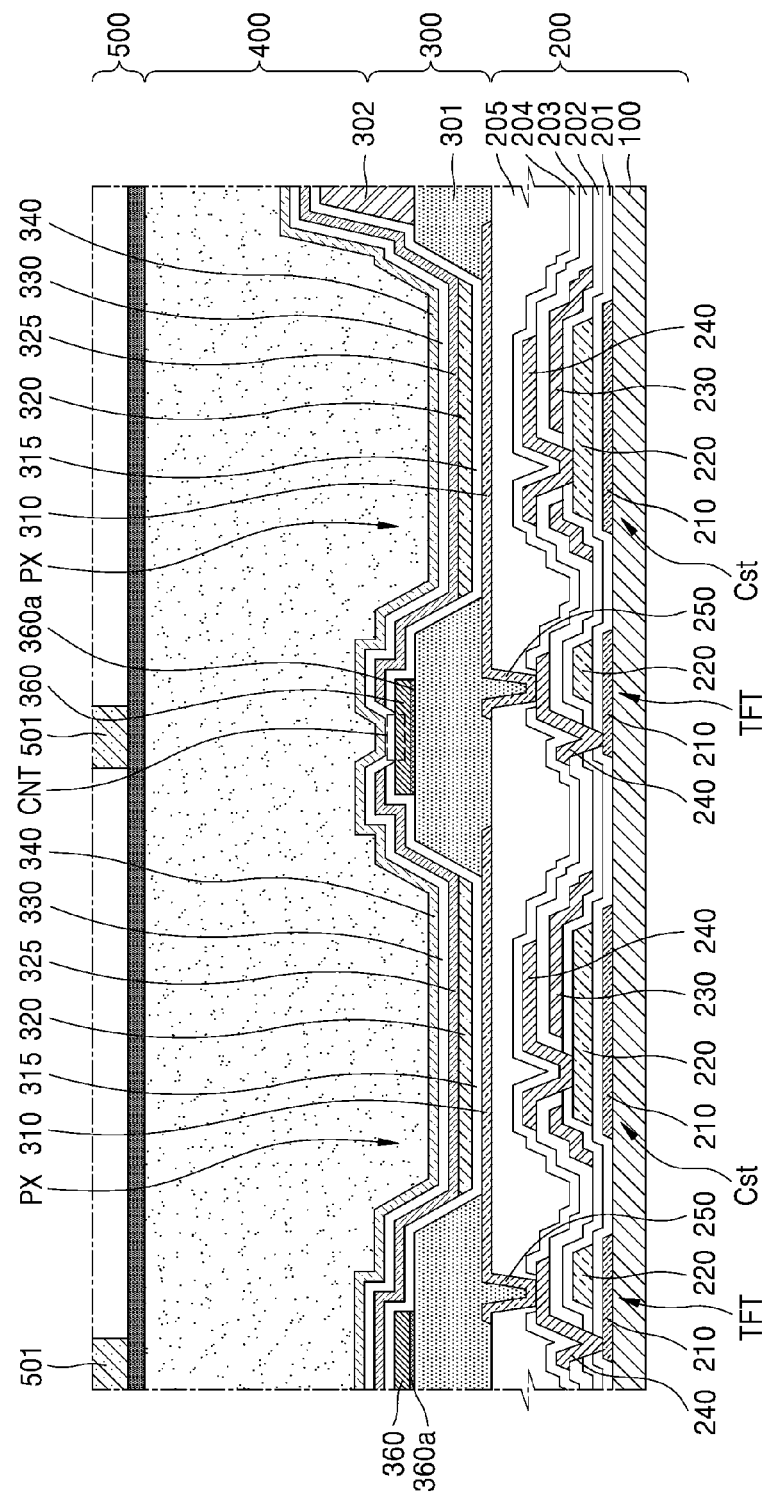
FIG. 9 is a schematic cross-sectional view of a modifiable example of FIG. 2.

Though the embodiment of FIG. 2 provides a double-layered structure of the first and second organic insulating layers 205 and 206 and the first and second source-drain electrodes 240 and 250, a single-layered structure including only the first organic insulating layer 205 and the first source-drain electrode 240 may be configured as shown in FIG. 9. The second power supply line 170 shown in FIG. 8A may be also configured in a single-layered wiring including only the first conductive layer 240a.

According to the display device described above, since a resistance of the opposite electrode may be reduced by electrically connecting the metal layer formed on the pixel-defining layer to the opposite electrode, issues such as a voltage drop, heat emission of high temperature, or a noise, etc. may be effectively resolved, and thus a uniform and clear image quality may be guaranteed and product reliability may be improved.

According to embodiments, issues such as a voltage drop, heat emission of high temperature, or a noise, etc. may be effectively resolved by electrically connecting the metal layer formed on the pixel-defining layer to the opposite electrode, and thus a uniform and clear image quality may be guaranteed and a product reliability may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims including any equivalents.

What is claimed is:

1. A display device comprising:
   sub-pixels disposed on a substrate, the sub-pixels each including:
   a pixel electrode;
   an opposite electrode facing the pixel electrode;
   an emission layer disposed between the pixel electrode and the opposite electrode; and
   a pixel-defining layer made of an organic material and completely surrounding the emission layer such that the pixel defining layer separates each sub-pixel from other sub-pixels; and
   a metal layer disposed between the pixel-defining layer and the opposite electrode, the metal layer contacting the opposite electrode.

2. The display device of claim 1, further comprising an inorganic protective layer disposed between the metal layer and the pixel-defining layer.

3. The display device of claim 2, wherein the inorganic protective layer includes material comprising at least one of indium zinc oxide (IZO), indium tin oxide (ITO), silicon oxide ($SiO_2$), silicon oxynitride (SiON), and silicon nitride ($SiN_x$).

4. The display device of claim 1, wherein the metal layer includes at least one layer of titanium (Ti) and at least one layer of aluminum (Al).

5. The display device of claim 4, wherein the at least one layer of titanium (Ti) and the at least one layer of aluminum (Al) are stacked relative to each other.

6. The display device of claim 1, wherein the metal layer includes:

pad portions contacting the opposite electrode above the pixel-defining layer; and connectors electrically connecting the pad portions to each other.

7. The display device of claim 6, wherein the connectors are disposed in a mesh shape crossing in a horizontal direction and a vertical direction, and the pad portions are disposed at intersections of the mesh shape.

8. The display device of claim 7, wherein the pad portions are disposed at every intersection.

9. The display device of claim 7, wherein the pad portions are disposed at less than all of the intersections.

10. The display device of claim 6, wherein all of the pad portions contact the opposite electrode.

11. A display device comprising:

a sub-pixels disposed on a substrate, the sub-pixels each including:

a pixel electrode;

an opposite electrode lacing the pixel electrode:

an emission layer disposed between the pixel electrode and the opposite electrode; and a pixel-defining layer surrounding the emission layer; and a metal layer disposing between the pixel-defining layer and the opposite electrode, and metal layer contacting the opposite electrode, wherein the metal layer includes;

pad portions contacting the opposite electrode above the pixel-defining layer, less than all of the pad portions contacting the opposite electrode; and connectors electrically connecting the pad portions to each other.

12. The display device of claim 6, further comprising spacers disposed on the pixel-defining layer between multiple pixels, the spacers protruding toward the opposite electrode.

13. The display device of claim 12, wherein the spacers are disposed for all of the sub-pixels.

14. The display device of claim 12, wherein the spacers are disposed for less than all of the sub-pixels.

15. The display device of claim 12, wherein the pad portions are disposed on all of the spacers.

16. The display device of claim 12, wherein the pad portions are disposed on less than all of the spacers.

17. The display device of claim 1, further comprising:

a display area in which the sub-pixels are disposed; and a cathode power supply unit disposed outside the display area, wherein the cathode power supply unit applies a same voltage to the opposite electrode of each sub-pixel and the metal layer.

18. The display device of claim 17, wherein the display area includes a first side, a second side, a third side, and a fourth side, wherein the first side and the second side face each other, the third side connects an end portion of the first side to an end portion of the second side, and the fourth side connects another end portion of the first side to another end portion of the second side, and the cathode power supply unit includes:

a power supply line surrounding the first side, the second side, and the third side, and surrounding a portion of the fourth side outside the display area;

a connection terminal of the metal layer electrically connected to the power supply line; and a connection terminal of the opposite electrode electrically connected to the connection terminal of the metal layer.

19. The display device of claim 18, further comprising:

an intermediate connection terminal disposed between the power supply line and the connection terminal of the metal layer, wherein the intermediate connection terminal and the pixel electrode include a same material and are disposed on a same layer, and respective layers from the power supply line to the connection terminal of the opposite electrode are disposed stepwise such that a step difference is provided between the respective layers.

20. The display device of claim 18, wherein a portion in which the power supply line, the metal layer, and the opposite electrode are electrically connected includes a portion in which the power supply line surrounds the first, second, and third sides.

21. The display device of claim 20, wherein the portion in which the power supply line, the metal layer, and the opposite electrode are electrically connected includes a portion in which the power supply line surrounds a portion of the fourth side.

22. The display device of claim 1, wherein the metal layer includes:

first parallel connectors extending in a first direction;

second parallel connectors extending in a second direction intersecting the first direction; and pad portions where first and second connectors intersect, wherein the first parallel connectors, the second parallel connectors, and the pad portions are disposed in a same layer.

23. The display device of claim 22, wherein the pad portions have a width greater than either of the first parallel connectors or the second parallel connectors.

* * * * *